(12) United States Patent
Chen et al.

(10) Patent No.: US 12,412,843 B2
(45) Date of Patent: Sep. 9, 2025

(54) SUPPORT FRAME STRUCTURE AND MANUFACTURING METHOD THEREOF

(71) Applicant: Zhuhai ACCESS Semiconductor Co., Ltd., Zhuhai (CN)

(72) Inventors: Xianming Chen, Zhuhai (CN); Lei Feng, Zhuhai (CN); Benxia Huang, Zhuhai (CN); Jindong Feng, Zhuhai (CN); Jiangjiang Zhao, Zhuhai (CN); Wenshi Wang, Zhuhai (CN)

(73) Assignee: ZHUHAI ACCESS SEMICONDUCTOR CO., LTD., Zhuhai (CN)

(*) Notice: Subject to any disclaimer, the term of this patent is extended or adjusted under 35 U.S.C. 154(b) by 6 days.

(21) Appl. No.: 18/099,107

(22) Filed: Jan. 19, 2023

(65) Prior Publication Data

US 2023/0154859 A1   May 18, 2023

Related U.S. Application Data

(62) Division of application No. 16/948,518, filed on Sep. 22, 2020, now Pat. No. 11,569,177.

(30) Foreign Application Priority Data

Jun. 28, 2020   (CN) .......................... 202010599238.6

(51) Int. Cl.
*H01L 23/498*   (2006.01)
*H01L 21/48*   (2006.01)
(Continued)

(52) U.S. Cl.
CPC ...... *H01L 23/5389* (2013.01); *H01L 21/4857* (2013.01); *H01L 23/49838* (2013.01);
(Continued)

(58) Field of Classification Search
CPC ............ H01L 21/4828; H01L 21/4857; H01L 23/49822; H01L 23/5383; H01L 23/5389;
(Continued)

(56) References Cited

U.S. PATENT DOCUMENTS

| 6,204,453 B1* | 3/2001 | Fallon | H05K 3/44 |
| | | | 174/255 |
| 2010/0236817 A1* | 9/2010 | Chen | H01L 23/49822 |
| | | | 257/E21.705 |
| 2016/0029488 A1* | 1/2016 | Kang | H05K 1/056 |
| | | | 174/262 |

* cited by examiner

*Primary Examiner* — Yu Chen
(74) *Attorney, Agent, or Firm* — The Dobrusin Law Firm, P.C.

(57) ABSTRACT

Disclosed are a method for manufacturing a support frame structure and a support frame structure. The support frame structure is used for embedded packaging, and includes: a metal plate comprising a support region and an opening region, at least one upper dielectric hole and at least one lower dielectric hole being formed respectively in upper and lower surfaces of the support region, the upper dielectric hole being communicated with the lower dielectric hole; at least one set of metal pillars comprising an upper metal pillar and a lower metal pillar, the upper metal pillar and the lower metal pillar being vertically connected to upper and lower surfaces of the metal plate, respectively; a dielectric layer comprising an upper dielectric layer and a lower dielectric layer, the upper dielectric layer and the lower dielectric layer being correspondingly formed on the upper surface of the metal plate and the upper dielectric hole and on a lower surface of the metal plate and the lower dielectric hole, respectively; and at least one core embedding cavity arranged in the opening region, running through the dielectric layer and the metal plate, and spaced from the upper dielectric hole and the lower dielectric hole by the dielectric layer.

5 Claims, 6 Drawing Sheets

(51) Int. Cl.
*H01L 23/538* (2006.01)
*H01L 23/552* (2006.01)

(52) U.S. Cl.
CPC .... *H01L 23/49861* (2013.01); *H01L 23/5383* (2013.01); *H01L 23/5386* (2013.01); *H01L 23/552* (2013.01)

(58) Field of Classification Search
CPC ......... H01L 23/49838; H01L 23/49844; H01L 23/5386; H01L 23/49861; H01L 23/552; H01L 23/13; H01L 23/42; H01L 23/433; H01L 2924/15153–15157; H01L 2924/15151; H05K 1/0207; H05K 1/021; H05K 1/183; H05K 1/05–056; H05K 2201/09745; H05K 2201/0969; H05K 2201/10416; H05K 3/46808; H05K 3/445; H05K 3/4608; H05K 3/4697
See application file for complete search history.

SUPPORT FRAME STRUCTURE AND MANUFACTURING METHOD THEREOF

CROSS-REFERENCE TO RELATED APPLICATIONS

This application is a divisional of an application Ser. No. 16/948,518, filed on Sep. 22, 2020, which is based on, and claims the benefit of Chinese patent application No. 202010599238.6, filed Jun. 28, 2020. The contents of each of the above-mentioned patent applications is hereby incorporated by reference herein in its entirety and made a part of this specification.

TECHNICAL FIELD

The present disclosure relates to the technical field of semiconductor packaging, and in particular to a support frame structure and a manufacturing method thereof.

BACKGROUND

With the rapid development of the electronics industry, the electronic products are becoming increasingly lighter and thinner, and the degree of integration is increasing. The packaging method for implementing embedded chips by support frames has been greatly developed. The overall requirements on the support frame structure include reliability and appropriate electrical performance, thinness, rigidity, flatness, good heat dissipation and competitive unit price.

Currently, for most of commercially available frames used for embedded packaging, a dielectric material is used as the main body of the support frame, and a large number of metal through hole pillar arrays are formed in the dielectric material. The matching of the frame and the embedded chips in height is realized by adjusting the height of the metal through hole pillars. After the support frame is packaged, the heat dissipation is mainly realized through the dielectric material and the window formed on the back side of the chips. However, the dielectric material has a low heat dissipation rate, and the embedded packaging requirements of high-power devices cannot be met.

SUMMARY

The present disclosure aims at solving one of the technical problems in the related art at least to certain extent. For this purpose, the present disclosure proposes a support frame structure and a manufacturing method thereof. The following is the summary of the subject described in detail herein. This summary is not intended to limit the protection scope defined by the claims. The technical schemes will be described below.

In a first aspect, an embodiment of the present disclosure provides a method for manufacturing a support frame structure, including following steps of:
  providing a metal plate including a support region and an opening region;
  forming at least one upper dielectric hole and at least one lower dielectric hole at upper and lower surfaces of the support region by photolithography, with a metal spacer connected between the upper dielectric hole and the lower dielectric hole;
  forming at least one upper metal pillar on an upper surface of the metal plate by electroplating, and laminating an upper dielectric layer which covers the upper metal pillar and the upper dielectric hole;
  etching the metal spacer, forming at least one lower metal pillar on a lower surface of the metal plate by electroplating, and laminating a lower dielectric layer which covers the lower metal pillar and the lower dielectric hole, the upper metal pillar and the lower metal pillar being arranged symmetrically about the metal plate; and
  polishing flat the upper dielectric layer and the lower dielectric layer corresponding to the upper surface and the lower surface as well as the upper metal pillar and the lower metal pillar, attaching a photosensitive dry film thereto, processing the photosensitive dry film by photolithography to form at least one pattern window in the opening region, and etching the pattern window to form a core embedding cavity.

The method for manufacturing a support frame structure according to an embodiment of the first aspect of the present disclosure at least includes the following beneficial effects: firstly, in the frame, metal is used as the support base material, and the metal, due to its good heat conductivity, can pass the heat generated when the chips are working through the metal layer in the frame to reduce the temperature of the chips, without requiring the formation of a window in the back side of the chips or the use of costly but high-heat-dissipation dielectric material for the purpose of heat dissipation; secondly, since the metal has certain rigidity and good ductility, the use of the metal plate as the core to form metal pillars and to cover the organic dielectric layer improves the warpage of packing; thirdly, the thickness of the frame can be increased by increasing the thickness of the core metal plate, thereby reducing the height of the electroplated metal pillars, reducing the risk of instability in the electroplating process, and meanwhile reducing the risk of the non-exposure of the metal pillars during the thinning and flattening process, and ensuring that the manufactured frames meet the design specification requirements; and fourthly, the method for manufacturing a support frame is simple and low in cost.

Optionally, in one embodiment of the present disclosure, the upper dielectric hole and the lower dielectric hole are aligned in a vertical direction.

Optionally, in one embodiment of the present disclosure, each of the upper metal pillar and the lower metal pillar includes a support metal pillar, and an opening metal pillar covered by the pattern window.

Optionally, in one embodiment of the present disclosure, the upper dielectric layer and the lower dielectric layer include prepregs, thermosetting organic resins such as thin-film resins, or thermoplastic organic resins such as polyethylene.

Optionally, in one embodiment of the present disclosure, the method further includes: forming a conducting layer and a protective layer successively on a surface of the upper dielectric layer.

Optionally, in one embodiment of the present disclosure, the conducting layer is metal titanium or copper.

Optionally, in one embodiment of the present disclosure, the protective layer is photosensitive dry film or liquid photoresist.

In a second aspect, an embodiment of the present disclosure provides a support frame structure used for embedded packaging, including:
  a metal plate including a support region and an opening region, at least one upper dielectric hole and at least one lower dielectric hole being formed respectively at upper and lower surfaces of the support region, the upper dielectric hole being communicated with the lower dielectric hole;

at least one set of metal pillars including an upper metal pillar and a lower metal pillar, the upper metal pillar and the lower metal pillar being vertically connected to upper and lower surfaces of the metal plate, respectively;

a dielectric layer including an upper dielectric layer and a lower dielectric layer, the upper dielectric layer and the lower dielectric layer being correspondingly formed on the upper surface of the metal plate and the upper dielectric hole and on the lower surface of the metal plate and the lower dielectric hole, respectively;

at least one core embedding cavity arranged in the opening region, running through the dielectric layer and the metal plate, and spaced from the upper dielectric hole and the lower dielectric hole by the dielectric layer.

The support frame structure according to an embodiment of the second aspect of the present disclosure at least includes the following beneficial effects: firstly, in the frame, metal is used as the support base material, and the metal, due to its good heat conductivity, can pass the heat generated when the chips are working through the metal layer in the frame to reduce the temperature of the chips, without requiring the formation of a window in the back side of the chips or the use of costly but high-heat-dissipation dielectric material for the purpose of heat dissipation; secondly, since the metal has certain rigidity and good ductility, the use of the metal plate as the core to form metal pillars and to cover the organic dielectric layer improves the warpage of packing; thirdly, the thickness of the frame can be increased by increasing the thickness of the core metal plate, thereby reducing the height of the electroplated metal pillars, reducing the risk of instability in the electroplating process, and meanwhile reducing the risk of the non-exposure of the metal pillars during the thinning and flattening process, and ensuring that the manufactured frames meet the design specification requirements; and fourthly, the method for manufacturing a support frame is simple and low in cost.

Optionally, in one embodiment of the present disclosure, the dielectric layer includes prepregs, thermosetting organic resins such as thin-film resins, or thermoplastic organic resins such as polyethylene.

Optionally, in one embodiment of the present disclosure, the metal plate or the metal pillar includes conductive metal or metal alloy.

Other features and advantages of the present disclosure will be described in the following description, and partly become apparent from the description or shall be understood by implementing the present disclosure. The purposes and other advantages of the present disclosure can be realized and obtained through the structures specifically specified in the specification, claims and drawings.

BRIEF DESCRIPTION OF THE DRAWINGS

The accompanying drawings are used to provide further understanding of the technical scheme of the present disclosure, and constitute part of the specification. The accompanying drawings are used to, together with the embodiments of the present disclosure, explain the technical scheme of the present disclosure, and do not constitute any limitation to the technical scheme of the present disclosure.

FIG. 11 is a sectional view of a support frame structure according to another embodiment of the present disclosure, in which:

100: metal plate; 110: support region; 120: opening region; 130: upper dielectric hole; 130*a*: upper dielectric hole window; 140: lower dielectric hole; 140*a*: lower dielectric hole window; 140*b*: lower dielectric hole window; 170: photosensitive dry film; 150: metal spacer; 600*a*: upper metal pillar; 600*b*: lower metal pillar; 210: upper dielectric layer; 220: lower dielectric layer; 300: pattern window; 400: core embedding cavity; 500: conducting layer; and 700: protective layer.

DETAILED DESCRIPTION

In order to make the purposes, technical schemes and advantages of the present disclosure clearer, the present disclosure will be further described below in detail with reference to the accompanying drawings by embodiments. It should be understood that the specific embodiments to be described here are only used to explain the present disclosure, not to limit the present disclosure, and therefore have no technical substantive meaning. Any structural modification, proportional change or size adjustment shall be within the scope of the technical content disclosed in the present disclosure without affecting the effects and purposes that can be achieved by the present disclosure.

This section will describe the specific embodiments of the present disclosure in detail. The preferred embodiments of the present disclosure are shown in the drawings. The drawings are provided to supplement, with graphics, the description of the text part of the specification, so that people can intuitively and visually understand technical features and overall technical scheme of the present disclosure, and should not be understood as any limitation to the protection scope of the present disclosure.

In the description of the present disclosure, "several" means "one or more"; "a plurality of" means "two or more"; "greater than", "less than", "exceeding" or the like should be considered as excluding the number; and "above", "below", "within" or the like should be considered as including the number. Terms "first" and "second" are used only for the purpose of distinguishing the technical features, and should not be understood as indicating or implying relative importance or implicitly indicating the number of the stated technical features or impliedly indicating the order of the stated technical features.

Figure 1:
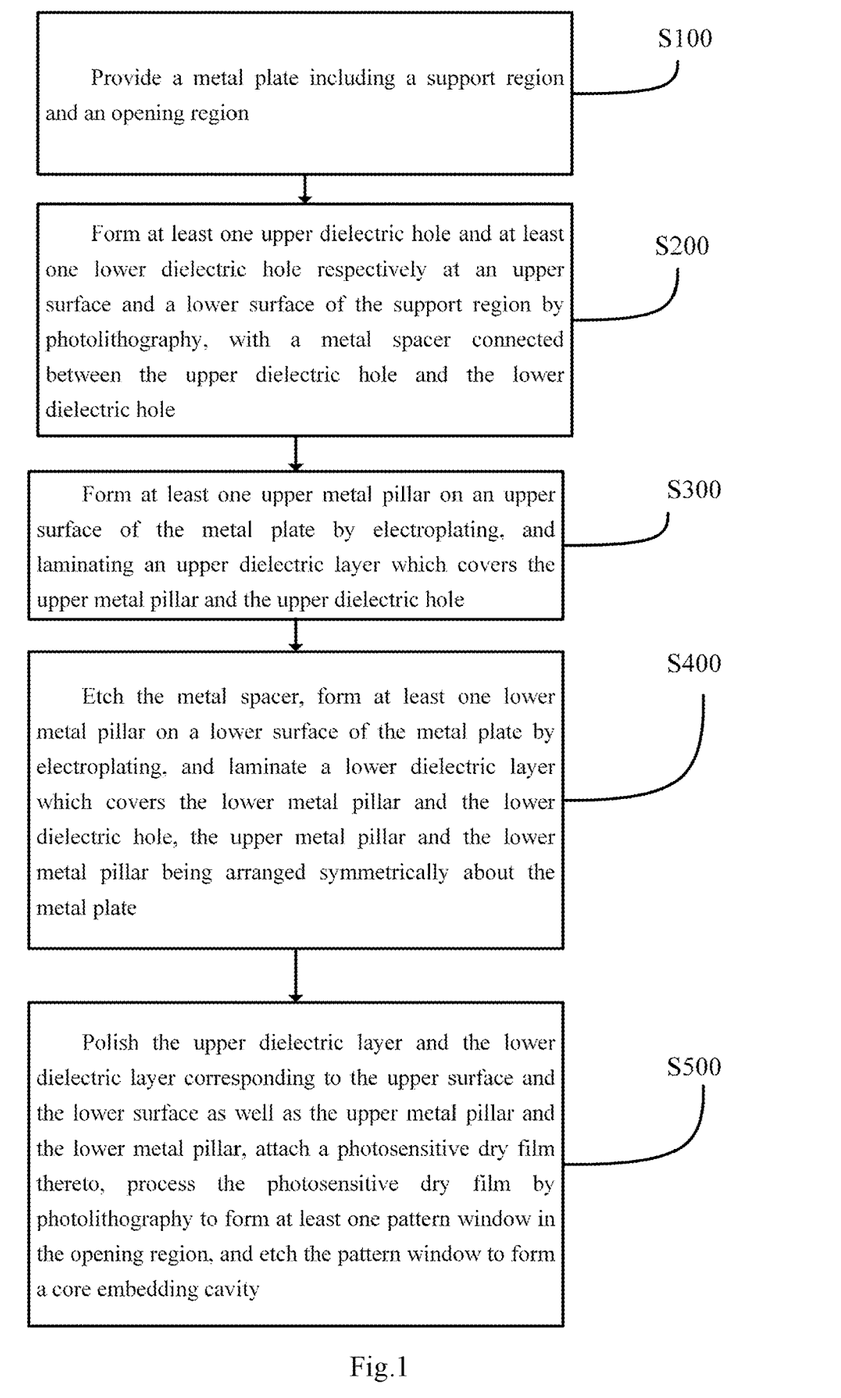
FIG. 1 is a flowchart of a method for manufacturing a support frame structure according to an embodiment of the present disclosure.
Figure 2:
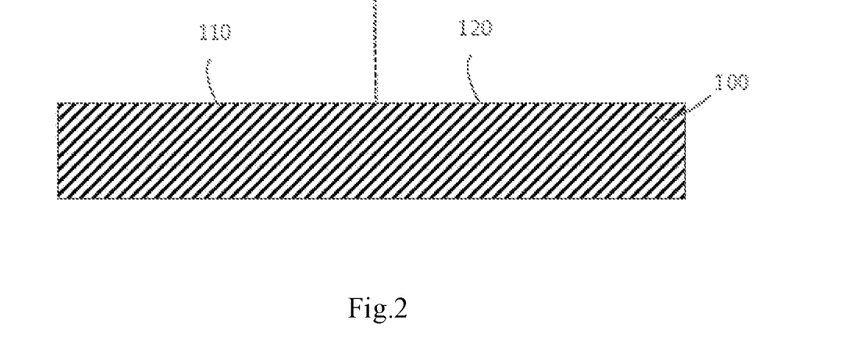
FIGS. 2-10 are sectional views of an intermediate state of a method for manufacturing a support frame structure according to another embodiment of the present disclosure.

Referring to FIG. 1, a method for manufacturing a support frame structure according to an embodiment of the present disclosure includes following steps of:

At S100, as shown in FIG. 2, a metal plate 100 is provided. Specifically, a prefabricated metal plate 100 is prepared. The metal plate 100 includes two surfaces in a vertical direction, an upper surface and an opposite lower surface; and includes a support region 110 and an opening region 120 in a horizontal direction. The support region 110 and the opening region 120 are divided according to different functions. The thickness and size of the metal plate 100 may be customized according to different needs. The material for the metal plate 100 may be one of metals or metal alloys such as copper, aluminum, and copper-aluminum alloy. Preferably, the material for the metal plate 100 in the present disclosure is metal copper.

Figure 3:
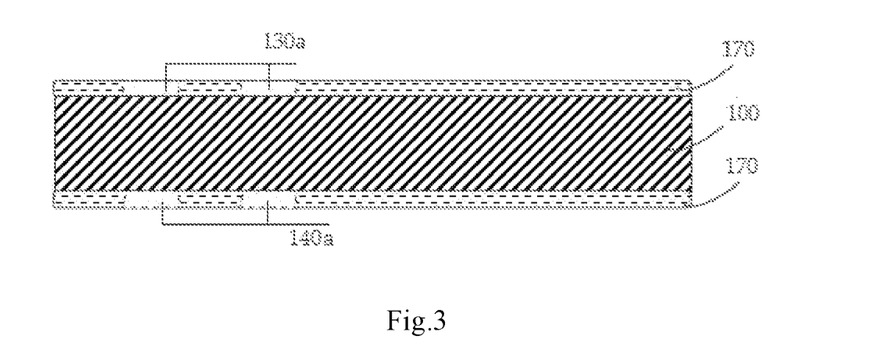

At S200, at least one upper dielectric hole 130 and at least one lower dielectric hole 140 are formed at upper surface and the lower surface of the support region 110 by photolithography, respectively, with a metal spacer 150 connected between the upper dielectric hole 130 and the lower dielectric hole 140. Specifically, as shown in FIG. 3, a PCB photoresist 170 is attached to the upper surface and a lower surface of the metal plate 100, and the PCB photoresist 170 is exposed and developed to form an upper dielectric hole window 130a and a lower dielectric hole window 140b.

Figure 4:
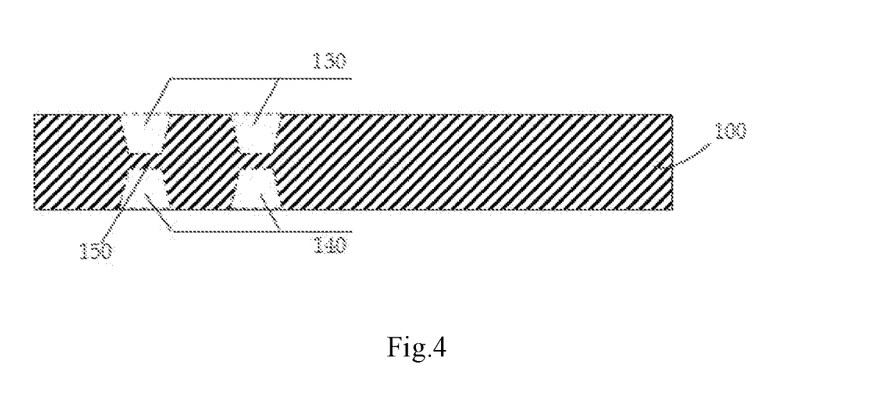

Referring to FIG. 4, the metal plate 100 is etched by using an etching process while controlling an etching depth. An upper dielectric hole 130 and a lower dielectric hole 140 of a specific depth are formed at the upper and lower surfaces of the metal plate 100, and a metal spacer 150 formed between the upper dielectric hole 130 and the lower dielectric hole 140. Then, the PCB photoresist 170 is removed. It should be noted that, when etching the upper surface and the lower surface of the metal plate 100 to form the dielectric holes, the etching depth needs to be controlled, and the metal spacer 150 is reserved to prevent the metal plate 100 from breaking and to facilitate subsequent steps.

Optionally, the PCB photoresist 170 includes a photosensitive dry film or a liquid photoresist. The PCB photoresist 170 is also called a photoresist, which becomes etching resistant film material after being irradiated or radiated by ultraviolet light, deep ultraviolet light, electron beams, ion beams, X-ray, etc. Preferably, the PCB photoresist 170 in the present disclosure is a photosensitive dry film. The region of the photosensitive dry film 170 other than the upper dielectric hole 130 and the lower dielectric hole 130 is exposed to light, and then developed to expose the upper dielectric hole window 130a and the lower dielectric hole window 140b.

Figure 5:
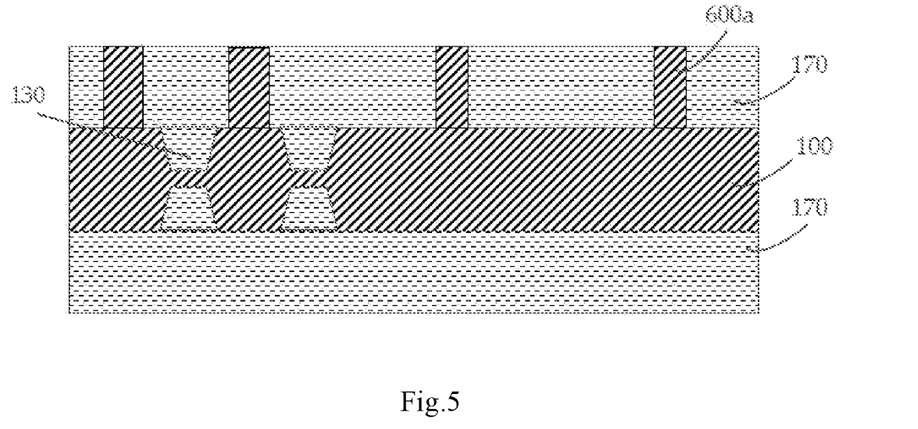
Figure 6:
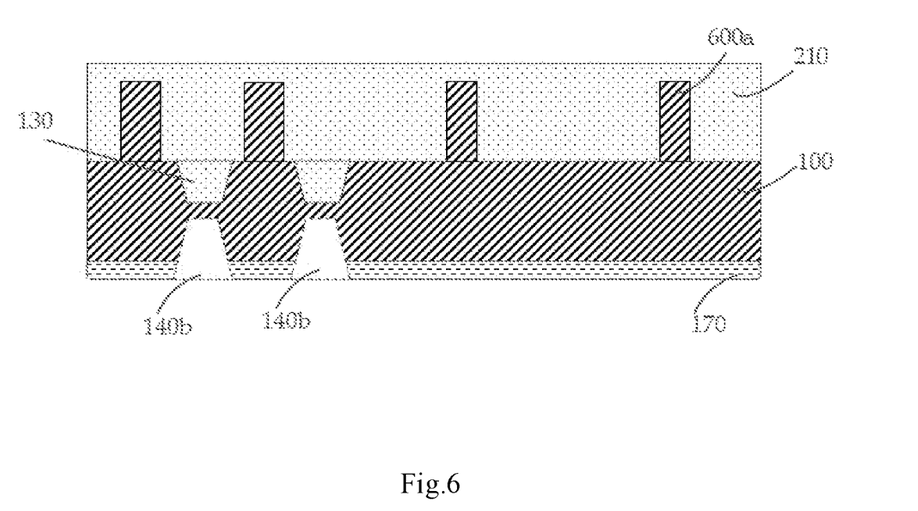

At S300, at least one upper metal pillar 600a is formed on the upper surface of the metal plate 100 by electroplating, and an upper dielectric layer 210 is laminated, the upper dielectric layer 210 covering the upper metal pillar 600a and the upper dielectric hole 130. Specifically, as shown in FIG. 5, the photosensitive dry film 170 is attached to the upper surface and the lower surface of the metal plate 100. First, the photosensitive dry film 170 on the upper surface is developed by photolithography to form a metal pillar through-hole, and the photosensitive dry film 170 on the lower surface is wholly exposed to light directly. The upper metal pillar through-hole is electroplated to form a conductive upper metal pillar 600a. It should be noted that the photosensitive dry film 170 is corrosion-resistant after exposure to light, so it can prevent the lower surface of the metal plate 100 from being etched. As shown in FIG. 6, the photosensitive dry film 170 is removed. Organic dielectric material is laminated on the upper surface to form the upper dielectric layer 210. The organic dielectric material fills the upper surface of the metal plate 100 and the upper dielectric hole 130. The photosensitive dry film 170 is further attached to the lower surface of the metal plate 100. By exposure to light and development, a lower dielectric hole window 140b is further formed on the lower surface of the metal plate 100 at a position corresponding to the lower dielectric hole 140. It should be noted that the organic dielectric material includes prepregs, thermosetting organic resins such as thin-film resins, or thermoplastic organic resins such as polyethylene. Preferably, the organic dielectric material in the present disclosure is prepreg.

Figure 7:
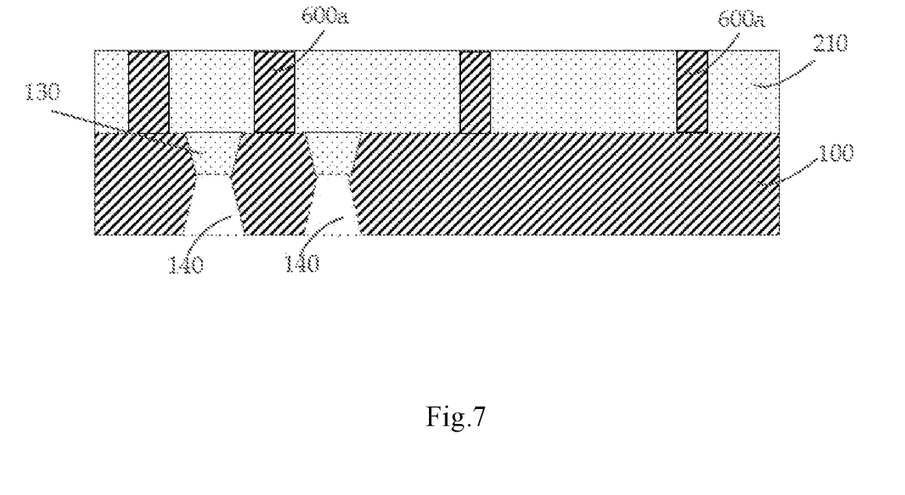
Figure 8:
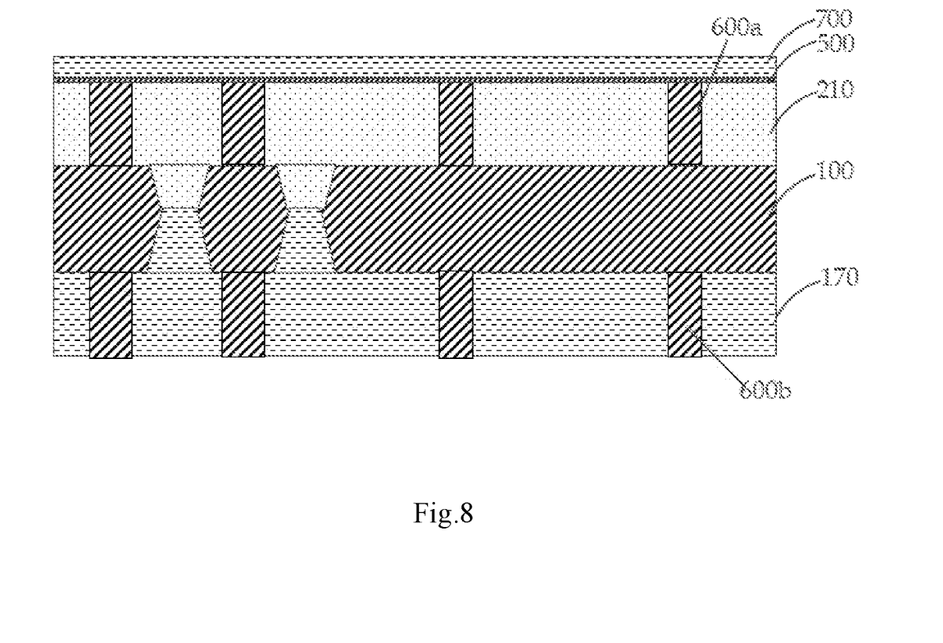
Figure 9:
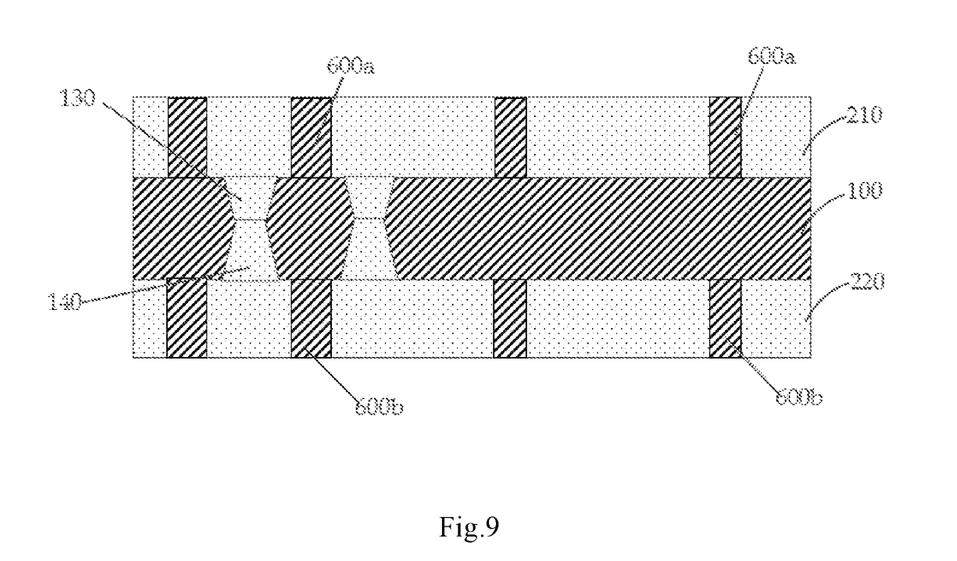

At S400, the metal spacer 150 is etched, at least one lower metal pillar 600b is formed on the lower surface of the metal plate 100 by electroplating, and a lower dielectric layer 220 is laminated, the lower dielectric layer 220 covering the lower metal pillar 600b and the lower dielectric hole 140, and the upper metal pillar 600a and the lower metal pillar 600b being arranged symmetrically about the metal plate 100. Specifically, as shown in FIG. 7, the metal spacer 150 between the upper dielectric hole 130 and the lower dielectric hole 140 is etched, so that the upper dielectric hole 130 is communicated with the lower dielectric hole 140; and then the photosensitive dry film 170 on the lower surface of the metal plate 100 is removed by a film stripper to expose the lower surface of the metal plate 100. The upper surface is ground flat by a plate polishing process. The upper metal pillar 600a laminated by the upper dielectric layer 210 is ground to expose a surface of the upper metal pillar 600a, so that the surface of the upper metal pillar 600a and a surface of the upper dielectric layer 210 are in a same plane. As shown in FIG. 8, the photosensitive dry film 170 is laminated on the surface of the upper dielectric layer 210 and on the lower surface of the lower metal plate 100. The photosensitive dry film 170 on the upper surface is exposed to light as a whole to form a protective layer 700 for protecting the upper circuit layer. Then, the photosensitive dry film 170 on the lower surface is exposed to light and developed to form a lower metal pillar 600b through-hole, and then a lower metal pillar 600b is formed by electroplating. As shown in FIG. 9, the photosensitive dry film 170 on the lower surface is removed by a film stripper to expose the surface of the lower metal pillar 600b and the lower surface of the metal plate 100. Organic dielectric material is laminated on the lower surface of the metal plate 100 to form a lower dielectric layer 220. The organic dielectric material fills the lower surface of the metal plate 100 and the lower dielectric hole 140 and covers the metal pillar. Then, the lower surface is ground flat by a plate polishing process. The lower metal pillar 600b laminated by the lower dielectric layer 220 is ground to expose the surface of the lower metal pillar 600b, so that the surface of the lower metal pillar 600b and the surface of the lower dielectric layer 220 are in a same plane.

It should be noted that the upper dielectric hole 130 and the lower dielectric hole 140 are aligned in the vertical direction and finally communicated with each other. The purpose is to break the metal plate 100 to form independent support metals. The center of the upper metal pillar 600a and the center of the lower metal pillar 600b are on a same vertical line in the vertical direction, and the upper metal pillar 600a and the lower metal pillar 600b are connected perpendicularly to the metal plate 100, to support the metal plate 100 from the upper and lower surfaces. The communication of the upper dielectric hole 130 with the lower dielectric hole 140 finally communicates the support metal, the upper metal pillar 600a (support metal pillar) and the lower metal pillar 600b (support metal pillar) to form an independent metal support frame, thereby forming a separate circuit connection path, thus being convenient for electrical communication with electronic components outside the frame or other frames.

Step S400 also includes S410 in which a conducting layer 500 and a protective layer 700 are formed successively on the surface of the upper dielectric layer 210. Specifically, after the upper dielectric layer 210 is thinned and flattened, the upper surfaces of all the upper metal pillars 600a are exposed, and the upper surface of the upper metal pillars 600a and the surface of the upper dielectric layer 210 are in a same plane. A metal seed layer is sputtered on the same flattened surface to form the conducting layer 500. As shown in FIG. 8, in S420, a photosensitive dry film 170 is attached to an upper surface of the conducting layer 500 to form a protective layer 700. The purpose of forming the conducting layer 500 is to provide electrodes in a chemical reaction tank by chemical plating to form a lower metal pillar 600b by electroplating. Preferably, the metal seed layer is composed of metal materials such as titanium and copper.

Figure 10:
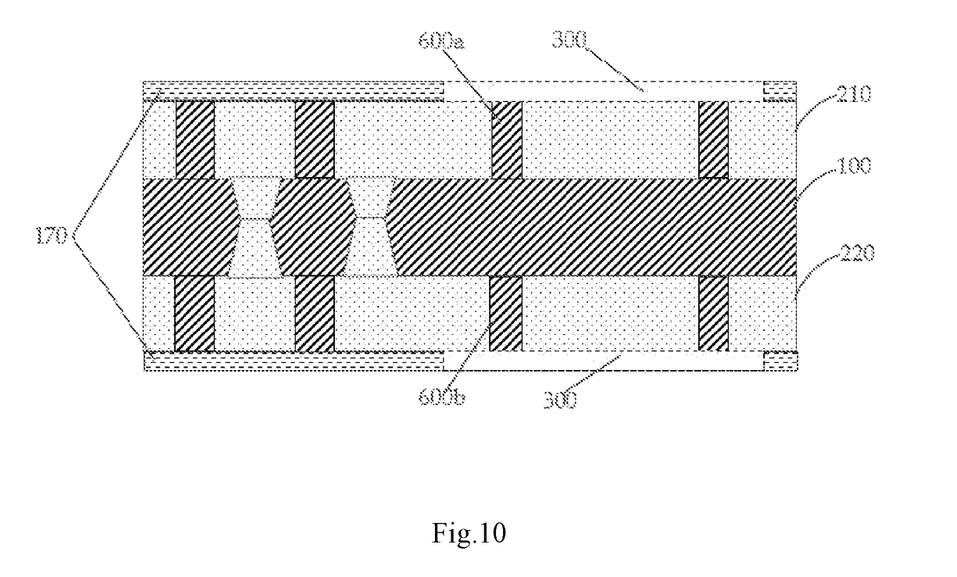
Figure 11:
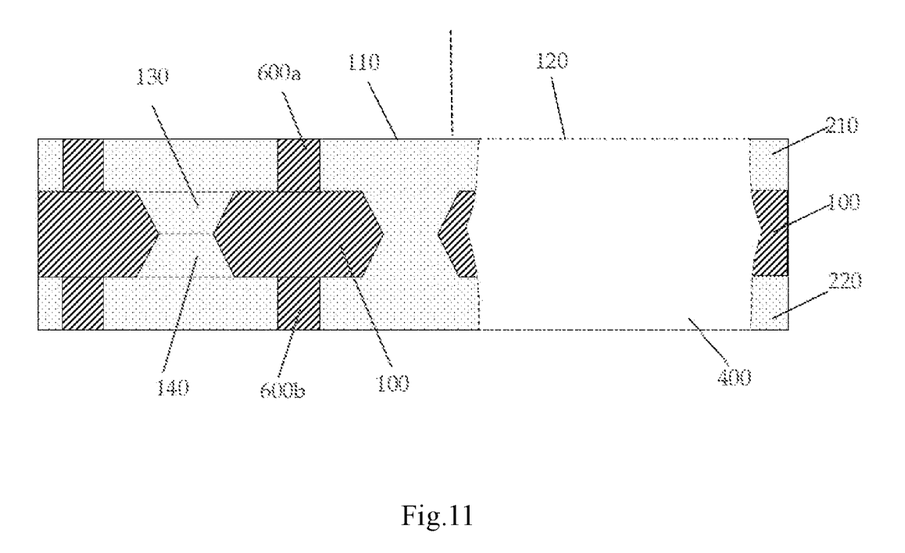

At S500, the upper dielectric layer 210, the lower dielectric layer 220, the upper metal pillar 600a, and the lower metal pillar 600b corresponding to the upper surface and the lower surface are ground flat and a photosensitive dry film 170 is attached thereto. The photosensitive dry film 170 is processed by photolithography to form at least one pattern window 300 in the opening region 120, and the pattern window 300 is etched to form a core embedding cavity 400. Specifically, as shown in FIG. 10, the upper and lower surfaces of the frame formed in S400 are further ground flat, and a photosensitive dry film 170 is attached thereto; the photosensitive dry film 170 is processed by exposure to light and development to form at least one pattern window 300; and the surface of the metal pillars (opening metal pillars) and the surface of the dielectric layer corresponding to the upper and lower surfaces are exposed in the opening region 120 of the metal plate 100. As shown in FIG. 11, the exposed metal pillars are etched, and the dielectric layer between the opening metal pillars is removed during the development process due to the lack of support of the metal pillars, thus forming the core embedding cavity 400, and then the photosensitive dry film 170 is removed by a film stripper to form a support frame.

It should be noted that the core embedding cavity 400 is used to embed electronic components. Electronic components include but are not limited to devices and chips. The devices and chips may be active devices or passive devices; or, in terms of the use purposes, may be high-power devices, radio frequency or logic chips. The size and number of core embedding cavity 400 may be determined according to the actual needs.

Based on the above-mentioned method for manufacturing a support frame structure, various embodiments of the support frame structure of the present disclosure are proposed.

Referring to FIG. 11, another embodiment of the present disclosure also provides a support frame structure used for embedded packaging, including: a metal plate 100 including a support region 110 and an opening region 120, at least one upper dielectric hole 130 and at least one lower dielectric hole 140 being formed respectively in upper and lower surfaces of the support region 110, the upper dielectric hole 130 being communicated with the lower dielectric hole 140; at least one set of metal pillars including an upper metal pillar 600a and a lower metal pillar 600b, the upper metal pillar 600a and the lower metal pillar 600b being vertically connected to upper and lower surfaces of the metal plate 100, respectively; a dielectric layer including an upper dielectric layer 210 and a lower dielectric layer 220, the upper dielectric layer 210 and the lower dielectric layer 220 being correspondingly formed on the upper surface of the metal plate 100 and the upper dielectric hole 130 and on a lower surface of the metal plate 100 and the lower dielectric hole 140, respectively; and at least one core embedding cavity 400 arranged in the opening region, running through the dielectric layer and the metal plate, and spaced from the upper dielectric hole 130 and the lower dielectric hole 140 by the dielectric layer.

In one embodiment, the set of metal pillars includes an upper metal pillar 600a and a lower metal pillar 600b. The center of the upper metal pillar 600a and the center of the lower metal pillar 600b are on a same vertical line in the vertical direction, and the upper metal pillar 600a and the lower metal pillar 600b are connected perpendicularly to the support metal to form a metal support frame, thereby forming a separate circuit connection path. It is convenient for electrical communication with electronic components outside the frame or other frames. The multiple metal support frames are isolated by the dielectric layer. The metal support frame is also provided with a core embedding cavity 400 which is used for embedding electronic components. The electronic components include but are not limited to devices and chips. The devices and chips may be active devices or passive devices; or, in terms of the use purposes, may be high-power devices, radio frequency or logic chips. The size and number of core embedding cavity 400 may be determined according to the actual needs. It should be noted that the side surface of the core embedding cavity 400 may or may not include metal edges. The core embedding cavity 400 including metal edges can further improve the heat dissipation efficiency of electronic components. During the packaging of multi-chip or multi-device electronic components, the metal edges provide not only heat dissipation, but also shielding effect, thereby reducing electromagnetic interference between electronic components.

An embodiment of the present disclosure provides a support frame structure, used for embedded packaging, wherein the dielectric layer includes prepregs, thermosetting organic resins such as thin-film resins, or thermoplastic organic resins such as polyethylene.

In one embodiment, the dielectric layer is organic material, including prepregs, thermosetting organic resins such as thin-film resins, or thermoplastic organic resins such as polyethylene. Preferably, the organic dielectric material in the present disclosure is a prepreg dielectric layer.

An embodiment of the present disclosure provides a support frame structure, used for embedded packaging, wherein the metal plate 100 or the metal pillar includes conductive metal or metal alloy.

In one embodiment, the support metal material may be one of metals or metal alloys such as copper, aluminum, and copper-aluminum alloy. Preferably, the material for the metal plate 100 in the present disclosure is metal copper.

The above is the specific description of preferred implementations of the present disclosure, but the present disclosure is not limited to the above-mentioned implementations. Those skilled in the art can make various equivalent modifications or replacements without departing from the spirit of the present disclosure, and those equivalent modifications or replacements shall be included in the scope defined by the claims of the present disclosure.

What is claimed:

1. A support frame structure used for embedded packaging, comprising:
   a metal plate comprising a support region and an opening region, at least one upper hole and at least one lower hole being formed respectively in an upper surface and a lower surface of metal plate in the support region and running through the metal plate in the support region, the upper hole being communicated with the lower hole;
   at least one set of metal pillars being arranged on the metal plate in the support region and comprising an upper metal pillar and a lower metal pillar, the upper metal pillar and the lower metal pillar being vertically connected to the upper surface and the lower surface of the metal plate in the support region, respectively;
   a dielectric layer comprising an upper dielectric layer and a lower dielectric layer, the upper dielectric layer and the lower dielectric layer being correspondingly formed on the upper surface of the metal plate and on the lower surface of the metal plate, and filling the upper hole and the lower hole, respectively, wherein an upper surface of the upper metal pillar and an upper surface of the upper dielectric layer are in the same plane, and a lower surface of the lower metal pillar and a lower surface of the lower dielectric layer are in the same plane, and the upper surface of the upper metal pillar and the upper surface of the upper dielectric layer in the support region form an upper surface of the support region, and the lower surface of the lower metal pillar and the lower surface of the lower dielectric layer in the support region form a lower surface of the support region; and at least one cavity for embedding an electronic component arranged in the opening region, running through the dielectric layer and the metal plate in the opening region, and spaced from the upper and lower metal pillars by the dielectric layer.

2. The support frame structure of claim 1, wherein the dielectric layer comprises prepregs, thermosetting organic resin or thermoplastic organic resins.

3. The support frame structure of claim 2, wherein the dielectric layer includes the thermosetting organic resins, wherein the thermosetting organic resins includes a thin film resin.

4. The support frame structure of claim 2, wherein the dielectric layer includes the thermoplastic organic resins, wherein the thermoplastic organic resins includes a polyethylene.

5. The support frame structure of claim 1, wherein the metal plate or the upper metal pillar or the lower metal pillar comprises conductive metal or metal alloy.

* * * * *